United States Patent
Eom

(10) Patent No.: US 9,524,975 B2
(45) Date of Patent: Dec. 20, 2016

(54) SEMICONDUCTOR DEVICE AND METHOD OF MANUFACTURING THE SAME

(71) Applicant: SK hynix Inc., Icheon-si Gyeonggi-do (KR)

(72) Inventor: Dae Sung Eom, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/636,265

(22) Filed: Mar. 3, 2015

(65) Prior Publication Data

US 2016/0111433 A1   Apr. 21, 2016

(30) Foreign Application Priority Data

Oct. 17, 2014   (KR) .................. 10-2014-0141046

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 27/115* (2006.01)

(52) U.S. Cl.
CPC ... *H01L 27/11526* (2013.01); *H01L 27/11548* (2013.01); *H01L 27/11573* (2013.01); *H01L 27/11575* (2013.01); *H01L 27/11556* (2013.01); *H01L 27/11582* (2013.01)

(58) Field of Classification Search
CPC .................. H01L 27/10855; H01L 27/10885; H01L 28/91; H01L 27/10894; H01L 21/76834; H01L 23/485; H01L 23/5226; H01L 27/11507; H01L 27/11526; H01L 27/11568; H01L 27/11573; H01L 27/11286; H01L 29/78
USPC ....................................................... 257/401
See application file for complete search history.

(56) References Cited

U.S. PATENT DOCUMENTS

| | | | | |
|---|---|---|---|---|
| 6,391,736 B1 * | 5/2002 | Uh et al. | ........... | 438/396 |
| 2014/0306279 A1 * | 10/2014 | Park et al. | ........... | 257/314 |
| 2015/0145015 A1 * | 5/2015 | Shin et al. | ........... | 257/314 |

FOREIGN PATENT DOCUMENTS

KR   1020110087199 A   8/2011

* cited by examiner

*Primary Examiner* — Thien F Tran
(74) *Attorney, Agent, or Firm* — William Park & Associates Ltd.

(57) ABSTRACT

Provided are a semiconductor device and a method of manufacturing the same. The semiconductor device may include a dummy structure formed on a peripheral region of a substrate, and insulating spacers configured to pass through the dummy structure and protrude from an upper surface of the dummy structure. The semiconductor device may include first contact plugs configured to pass through the insulating spacers and protrude from upper surfaces of the insulating spacers.

17 Claims, 4 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2014-0141046 filed on Oct. 17, 2014, in the Korean Intellectual Property Office, the entire disclosure of which is incorporated by reference herein.

BACKGROUND

1. Technical Field

Various embodiments generally relate to an electronic device and a method of manufacturing the same, and more particularly, to a semiconductor device including a 3-dimensional structure and a method of manufacturing the same.

2. Related Art

A nonvolatile memory is a memory device maintains stored data although the power supply to the memory device may cut off. A 2-dimensional memory device is formed with a memory cell on a silicon substrate as a single layer. Recently, the degree of integration for a 2-dimensional memory device has reached a limit. Because the 2-dimensional memory device has reached an integrating limit a 3-dimensional nonvolatile memory device has been proposed. A 3-dimensional nonvolatile memory device is formed with vertically stacked memory cells on a silicon substrate.

An existing 3-dimensional memory device may include a cell region whereby a cell array is formed and a peripheral region whereby a circuit configured to drive the cell array is formed. Also, since the memory cells are stacked in the cell region, the degree of integration of the memory device may be increased when compared to the 2-dimensional memory device.

However, since the memory cells are stacked in the cell region in contrast to a circuit included in the peripheral region as a single layer, a step difference between the cell region and the peripheral region is large. Thus, there are many difficulties associated with the manufacturing process of the 3-dimensional memory device, and the probability of generating a defect is also high.

BRIEF SUMMARY

In an embodiment, a semiconductor device may include a dummy structure formed on a peripheral region of a substrate. The semiconductor device may include insulating spacers configured to pass through the dummy structure and protrude from an upper surface of the dummy structure. The semiconductor device may include first contact plugs configured to pass through the insulating spacers and protrude from upper surfaces of the insulating spacers.

In an embodiment, a method of manufacturing a semiconductor device may include forming a cell structure disposed on a cell region of a substrate and a dummy structure disposed on a peripheral region of the substrate in. The method of manufacturing the semiconductor device may include forming a first interlayer insulating layer on the substrate, the cell structure and the dummy structure formed on the substrate. The method of manufacturing the semiconductor device may include forming insulating spacers passing through the first interlayer insulating layer and the dummy structure, and forming a second interlayer insulating layer on the first interlayer insulating layer. The method of manufacturing the semiconductor device may include forming first contact plugs passing through the second interlayer insulating layer and the insulating spacers.

In an embodiment, a semiconductor device may include a stacked structure formed on a region of a substrate, and insulating spacers configured to pass through the dummy structure and protrude from an upper surface of the stacked structure. The semiconductor device may include contact plugs configured to pass through the insulating spacers and protrude from upper surfaces of the insulating spacers.

DETAILED DESCRIPTION

Figure 1:
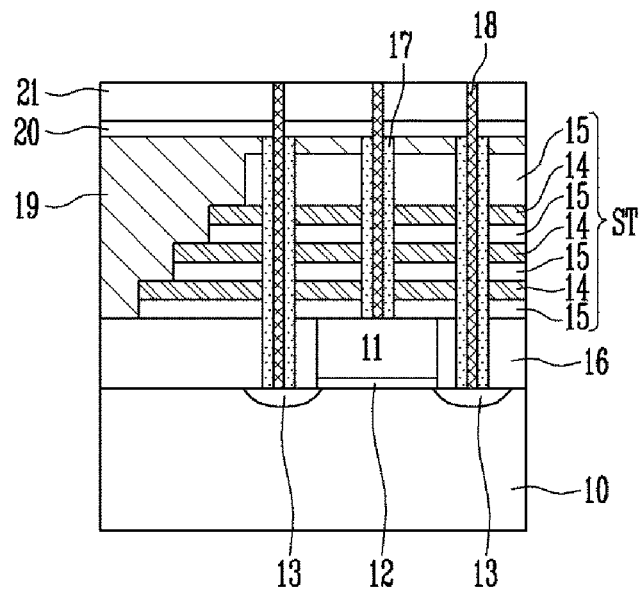
FIG. 1 is a cross-sectional view illustrating an example of a representation of a structure of a semiconductor device according to an embodiment.

Hereinafter, best modes may be explained. In the drawings, the thicknesses of layers and regions are expressed for convenience of the explanation, and may be exaggerated with respect to an actual physical thickness. In the explanation, a well known structure, which is not related to the scope of the discussion, may be omitted. In numbering reference numerals to the structural parts of each drawing, like numerals may refer to like elements throughout the description of the figures although the reference numerals are displayed in different drawings.

Various embodiments may be directed to a semiconductor device having a stable structure, and a method of manufacturing the same.

FIG. 1 is a cross-sectional view illustrating an example of a representation of a structure of a semiconductor device according to an embodiment.

Referring to FIG. 1, the semiconductor device according to an embodiment may include contact plugs 18. The contact plugs may pass through a stacked structure ST formed on a substrate 10. The semiconductor device may include insulating spacers 17. The insulating spacers 17 may surround the contact plugs 18.

A transistor may be disposed under the stacked structure ST. For example, the transistor may include a gate electrode 11, and gate insulating layer 12 interposed between the gate electrode 11 and the substrate 10. For example, the transistor may include junctions 13 formed at both sides of the gate electrode 11 in the substrate 10. The transistor may be a portion of a peripheral circuit disposed in a peripheral region. The peripheral circuit may be used to drive a cell array.

The stacked structure ST may include first material layers 14 and second material layers 15. The first material layers 14 and second material layers 15 may be alternately stacked. The first material layers 14 may include a material including a high etch selectivity with respect to the second material layers 15. For example, the first material layers 14 may include a nitride and the second material layers 15 may include an oxide, or, for example, the first material layers 14 may include a conductive material and the second material layers 15 may include an insulating material. The stacked structure ST may be a cell structure including memory cells disposed and stacked in the cell region, or a dummy structure disposed in the peripheral region. A sidewall of the stacked structure ST may be patterned in a stepwise shape.

A first insulating layer 16 may be interposed between the stacked structure ST and the substrate 10. A first interlayer insulating layer 19 may be disposed on the stacked structure ST. A second interlayer insulating layer 21 may be disposed on the first interlayer insulating layer 19. An etch stop layer 20 may be interposed between the first interlayer insulating layer 19 and the second interlayer insulating layer 21.

The insulating spacers 17 pass through the first interlayer insulating layer 19 and the stacked structure ST, and may be formed in a hollow tube structure having an open central region. Each of the spacers 17 may have various cross sectional shapes such as a cylindrical shape, an elliptical shape, a quadrangular shape, and/or the like. Contact plugs 18 pass through the second interlayer insulating layer 21, the etch stop layer 20, the first interlayer insulating layer 19, and the stacked structure ST. The contact plugs 18 may be formed in the open central region of the insulating spacers 17. The contact plugs 18 pass through the insulating spacers 17, and the insulating spacers 17 surround sidewalls of the contact plugs 18.

The contact plugs 18, for example, may protrude from upper surfaces of the insulating spacers 17. The insulating spacers 17 may not pass through the etch stop layer 20 and the second interlayer insulating layer 21, and may only be interposed between the contact plugs 18 and the stacked structure ST and between the contact plugs 18 and the first insulating layer 16.

Figure 2A:
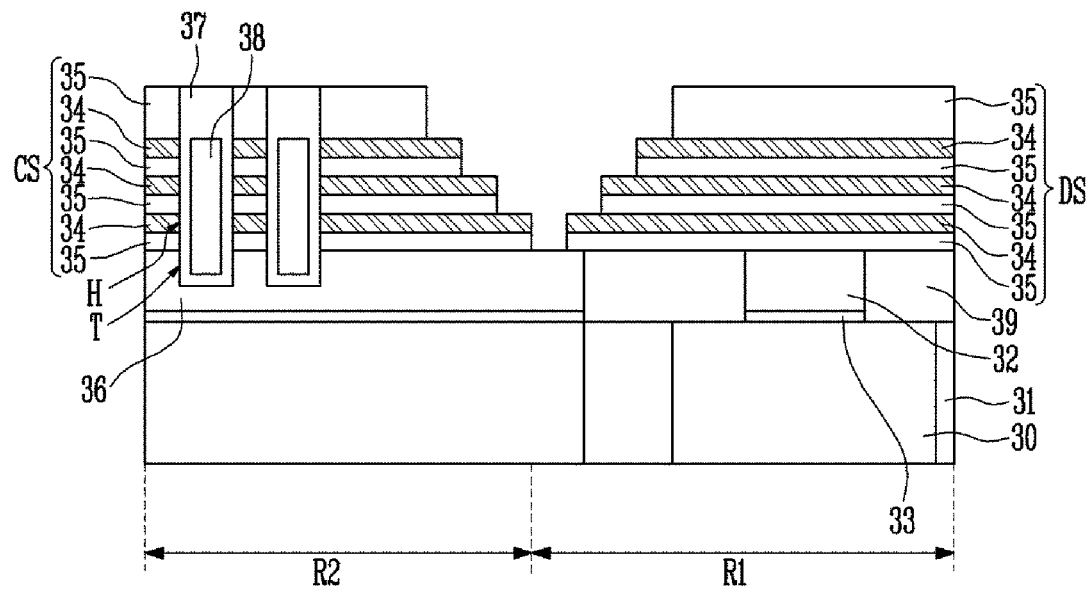
FIGS. 2A to 2C are cross-sectional views illustrating an example of a representation of a method of manufacturing a semiconductor device according to an embodiment.
Figure 2B:
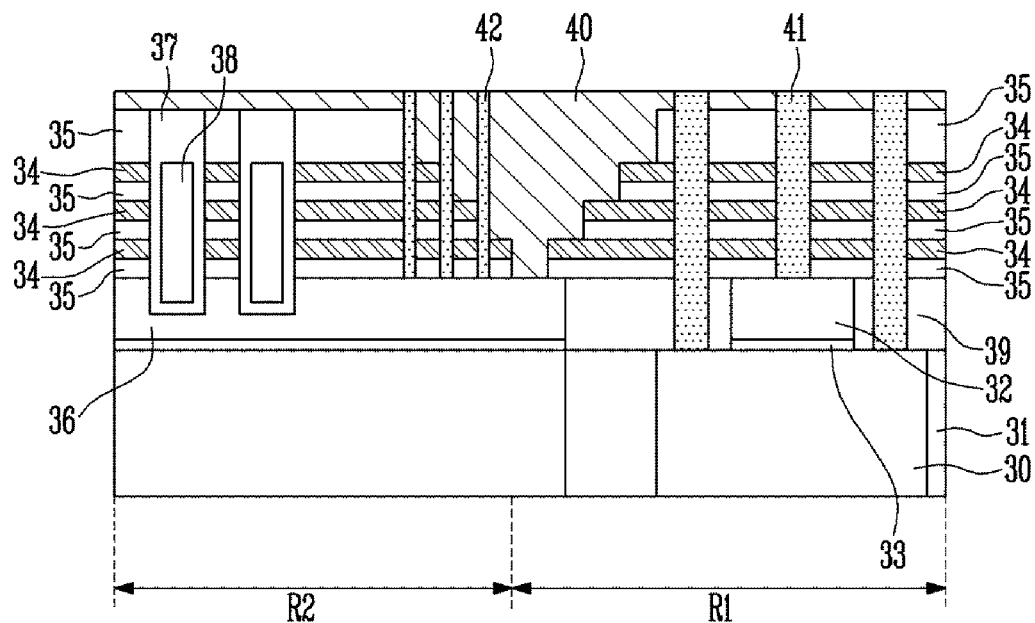
Figure 2C:
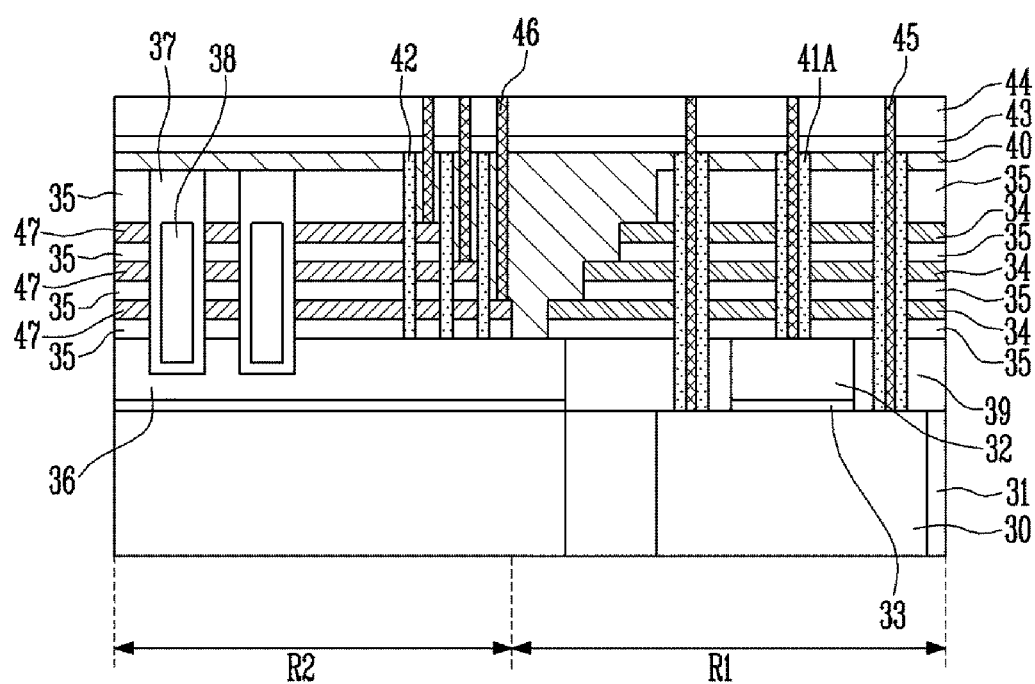

FIGS. 2A to 2C are cross-sectional views illustrating an example of a representation of a method of manufacturing a semiconductor device according to an embodiment.

Referring to FIG. 2A, transistors and structures are formed on a substrate 30. The substrate 30 may include a first region R1 and a second region R2. Here, the first region R1 may be a peripheral region, and the second region R2 may be a cell region. Memory strings including stacked memory cells may be disposed in the cell region, and a peripheral circuit configured to drive a cell array may be disposed in the peripheral region. For example, the memory strings may be arranged in a linear shape, vertically protruding from a surface of the substrate 30, or arranged in a U-shape, a W-shape, and/or the like. The memory string of the linear shape may include at least one lower select transistor, memory cells, and at least one upper select transistor connected in series. The memory string arranged in the U-shape or the W-shape may include at least one first select transistor, first memory cells, a pipe transistor, second memory cells, and at least one second select transistor connected in series. In an embodiment, the manufacturing method will be explained with respect to the memory strings arranged in the U-shape.

First, a device isolation layer 31 may be formed in the substrate 30. The device isolation layer 31 may be configured to define an active region, and may include an oxide.

Then, transistors including gate electrodes 32 and gate insulating layers 33 may be formed on the substrate 30 in the first region R1. A gate electrode 36 of the pipe transistor may be formed while the gate electrode 32 is formed. For example, after a conductive layer is formed on the substrate 30 on which the gate insulating layer 33 is formed, the conductive layer is patterned, and thus, the gate electrode 32 and the gate electrode 36 of the pipe transistor are formed.

An insulating layer 39 may be formed in a region from which the conductive layer is etched. Here, the gate electrode 32 and the gate electrode 36 of the pipe transistor may include doped polysilicon. For reference, when the memory strings are arranged in a linear shape, a conductive layer to form a gate electrode of the lower select transistor may be formed with the gate electrode 32.

Then, a first structure disposed in the first region R1, a second structure disposed in the second region R2, and semiconductor patterns 37 passing through the first structure may be formed. The first structure may be the dummy structure DS, and the second structure may be the cell structure CS. The semiconductor pattern 37 may be a channel layer.

The corresponding processes will be described as follows. First, after the gate electrode 36 of the pipe transistor is etched and a trench T is formed, a sacrificial layer (not illustrated) may be formed in the trench T. Then, first material layers 34 and second material layers 35 are alternately formed on the substrate 10 in the first region R1 and the second region R2. The first material layers 34 may be formed of a material having an etching selectivity higher than the second material layers 35. For example, the first material layers 34 are sacrificial layers including a nitride, and the second material layers 35 are insulating layers including an oxide. In an embodiment, the first material layers 34 may be conductive layers including doped polysilicon, and the second material layers 35 may be insulating layers including an oxide. In an embodiment, the first material layers 34 may be conductive layers including doped polysilicon, and the second material layers 35 may be sacrificial layers including undoped polysilicon. In an embodiment, an example in which the first material layers 34 are sacrificial layers, and the second material layers 35 are insulating layers will be described.

After holes H which pass through the first and second material layers 34 and 35 in the second region R2 and are connected to the trenches T are formed, sacrificial layers in the trenches T are removed through the holes H. Then, the semiconductor patterns 37 are formed in the trenches T and the holes H. The semiconductor patterns 37 may be in a completely filled shape toward a center, a hollow shape having an open central region, or a shape combined thereof. An insulating layer 38 may be filled in the open central region. Before the semiconductor patterns 37 are formed, a memory layer (not illustrated) may be formed in the trenches T and the holes H. The memory layer may include a tunnel insulating layer, a data storage layer, and a charge blocking layer sequentially surrounding the semiconductor patterns 37. The data storage layer may include silicon, a nitride, a nanodot, a phase transition material, and/or the like.

When the memory string is in the linear shape, the formation of the trench T and the sacrificial layer may be omitted, and the hole H may be formed to completely pass through the lower gate electrode and expose the substrate 10. In this example, the semiconductor patterns 37 may be connected to source regions of the substrate 10. In an embodiment, a process of forming a memory string may be variously changed.

Then, the first and second material layers 34 and 35 are patterned and the cell structure CS and the dummy structure DS are formed. For example, a mask pattern is reduced from an interface between the first region R1 and the second region R2 and the etching process is repeated, and thus, the cell structure CS and the dummy structure DS including contact regions patterned in a stepwise shape are formed.

Before the semiconductor patterns 37 are formed, the first and second material layers 34 and 35 may be patterned in a stepwise shape.

Referring to FIG. 2B, a first interlayer insulating layer 40 may be formed on the substrate 10 on which a cell structure CS and a dummy structure DS are formed. The first interlayer insulating layer 40 may be formed by filling a gap region between the cell structure CS and the dummy structure DS and covering upper portions of the cell structure CS and the dummy structure DS. The first interlayer insulating layer 40 may include, for example, an oxide. In an embodiment, since the dummy structure DS is disposed in the first region R1 and the cell structure CS is disposed in the second region R2, a difference between heights of the first region R1 and the second region R2 is nearly nonexistent. Thus, the first interlayer insulating layer 40 may be formed to have a uniform height, and a planarization process may be omitted.

Then, first insulating patterns 41 disposed in the first region R1 and second insulating patterns 42 disposed in the second region R2 are formed. For example, after holes passing through the first interlayer insulating layer 40 and the dummy structure DS, or the first interlayer insulating layer 40 and the cell structure CS are formed, an insulating layer is filled in the holes, and thus, the first and second insulating patterns 41 and 42 are formed. The first and second insulating patterns 41 and 42 may include, for example, oxides.

The first insulating patterns 41 may be formed to pass through the first interlayer insulating layer 40 and the dummy structure DS, or the first interlayer insulating layer 40, the dummy structure DS, and the insulating layer 39. The first insulating patterns 41 may be connected to the transistors, and the gate electrodes 32 or junctions of the transistors.

The second insulating patterns 42 may be formed to pass through the first interlayer insulating layer 40 and the cell structure CS. The second insulating patterns 42 may pass through a part of the gate electrode 36 of the pipe transistor. The second insulating patterns 42 may be formed to have a predetermined interval in contact regions patterned in a stepwise shape.

The first insulating patterns 41 may be formed to have enough width so that first contact plugs are formed in them, and may have cross sectional shapes such as a circular shape, an elliptical shape, a quadrangular shape, a polygonal shape, and/or the like.

Referring to FIG. 2C, after the first material layers 34 in the second region R2 are removed, conductive layers 47 may be formed. For example, after slits passing through the first and second material layers 34 and 35 in the second region R2 and are disposed between the semiconductor patterns 37 are formed, the first material layers 34 exposed through the slits may be removed. Here, the first material layers 34 are selectively removed, and the remaining second material layers 35 are supported by the semiconductor patterns 37 and the second insulating patterns 42. The second insulating patterns 42 may be used as supports. Then, the conductive layers 47 may be formed in regions from which the first material layers 34 are removed. The conductive layers 47 may be gate electrodes of the memory cell, or gate electrodes of select transistors. The conductive layers 47 may include, for example, tungsten (W), tungsten nitride (WNx), titanium (Ti), titanium nitride (TiN), tantalum (Ta), tantalum nitride (TaN), and/or the like.

Some of the processes may be changed based on the types of the first and second material layers 34 and 35. When the first material layers 34 are conductive layers and the second material layers 35 are nitride layers, a process of silicidizing the first material layers 34 exposed through the slits may be performed. When the first material layers 34 are conductive layers and the second material layers 35 are sacrificial layers, the second material layers 35 may be replaced by insulating layers.

Then, a second interlayer insulating layer 44 may be formed on the first interlayer insulating layer 40. The second interlayer insulating layer 44 may include an oxide. Before the second interlayer insulating layer 44 is formed, an etch stop layer 43 may be formed. The etch stop layer 43 may include a nitride.

Then, after holes are formed in the first and second regions R1 and R2, first and second contact plugs 45 and 46 are formed in the holes. The holes may have different depths, and the first and second contact plugs 45 and 46 may be formed of conductive layers such as, for example, doped polysilicon, tungsten, and/or the like.

The first contact plugs 45 passing through the second interlayer insulating layer 44, the etch stop layer 43, the first interlayer insulating layer 40, and the first insulating pattern 41 are formed in the first region R1. Some of the first contact plugs 45 may be formed to a depth at which the some of the first contact plugs 45 directly contact the gate electrode 32 of the transistor, some others of the first contact plugs 45 may be formed to a depth at which the some others of the first contact plugs 45 directly contact the junctions of the transistor by passing through the insulating layer 39. When the holes are formed, the first insulating patterns 41 are etched and insulating spacers 41A are formed, and thus, the insulating spacers 41A surround sidewalls of the first contact plugs 45. The insulating spacers 41A may protrude from an upper surface of the dummy structure DS, and the first contact plugs 45 may protrude from upper surfaces of the insulating spacers 41A.

When the first material layers 34 in the second region R2 are replaced by the conductive layers 47, the first material layers 34 in the first region R1 may be replaced by the conductive layers 47. In this example, the first contact plugs 45 and the conductive layers 47 may be insulated by the insulating spacers 41A interposed between the first contact plugs 45 and the dummy structure DS.

The second contact plugs 46 passing through the second interlayer insulating layer 44, the etch stop layer 43, and the first interlayer insulating layer 40 may be formed in the second region R2. The second contact plugs 46 may be formed on the conductive layers 47 having various depths at which the second contact plugs 46 are respectively connected to the conductive layers 47, and interposed between the second insulating patterns 42.

Figure 3:
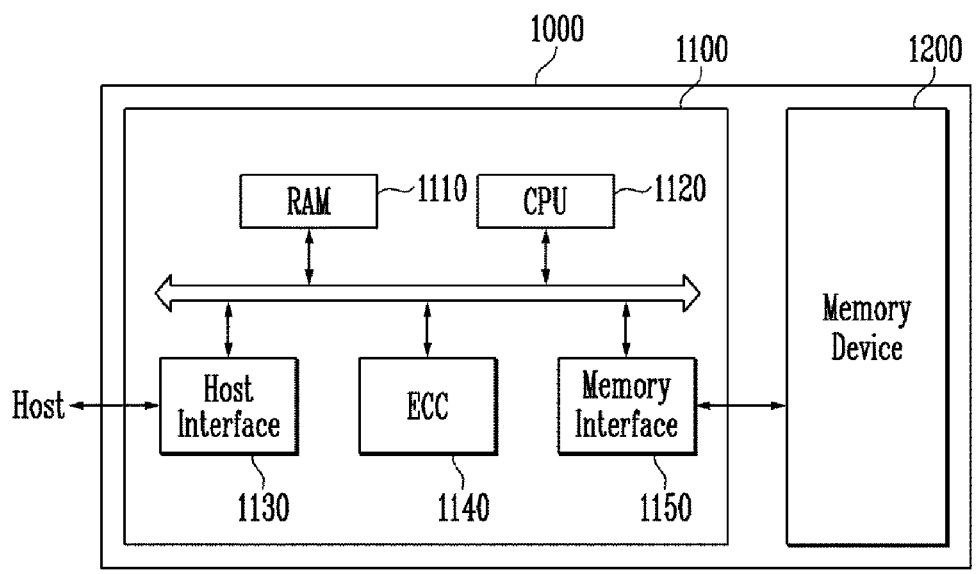
FIGS. 3 and 4 are block diagrams illustrating an example of a representation of structures of memory systems according to an embodiment.

FIG. 3 is a block diagram illustrating an example of a representation of a structure of a memory system according to an embodiment.

Referring to FIG. 3, the memory system 1000 according to the various embodiments may include a memory device 1200 and a controller 1100.

The memory device 1200 may be used to store data information having various data forms such as text, graphics, software codes, and/or the like. The memory device 1200 may be a nonvolatile memory, and include the structures described above with reference to FIGS. 1 to 2C. The memory device 1200 may be configured to include a dummy structure formed in a peripheral region of a substrate, insulating spacers passing through the dummy structure and protruding from an upper surface of the dummy structure, and first contact plugs passing through the insulating spacers and protruding from upper surfaces of the insulating spacers.

A structure and a manufacturing method of the memory device 1200 are the same as described above, and thus, a detailed explanation is omitted.

The controller 1100 is connected to a host Host and the memory device 1200, and is configured to access the memory device 1200 in response to a request of the host Host. For example, the controller 1100 is configured to control read, write, erase, and background operations, and/or the like, of the memory device 1200.

The controller 1100 may include a random access memory (RAM) 1110, a central processing unit (CPU) 1120, a host interface 1130, and an error correction code (ECC) circuit 1140, a memory interface 1150, and/or the like.

The RAM 1110 may be configured to be used as an operation memory of the CPU 1120, a cache memory interposed between the memory device 1200 and the host Host, a buffer memory interposed between the memory device 1200 and the host Host, and/or the like. For reference, the RAM 1110 may be replaced by a static random access memory (SRAM), a read only memory (ROM), and/or the like.

The CPU 1120 may be configured to control overall operations of the controller 1100. For example, the CPU 1120 may be configured to operate firmware such as a flash translation layer (FTL) stored in the RAM 1110, and/or the like.

The host interface 1130 may be configured to interface with the host Host. For example, the controller 1100 may be configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The ECC circuit 1140 may be configured to detect and correct an error included in data read from the memory device 1200 using an ECC.

The memory interface 1150 may be configured to interface with the memory device 1200. For example, the memory interface 1150 may include a NAND interface or a NOR interface.

For reference, the controller 1100 may further include a buffer memory (not illustrated) which temporarily stores data. The buffer memory may be used to temporarily store data to be transmitted to the outside through the host interface 1130, or temporarily store data transmitted from the memory device 1200 through the memory interface 1150. Also, the controller 1100 may further include a ROM for storing code data and for interfacing with the host Host.

As described in the above descriptions, the memory system 1000 according to an embodiment may include the memory device 1200 which may be easily manufactured and has a stable structure, and thus, characteristics of the memory system 1000 may also be improved.

Figure 4:
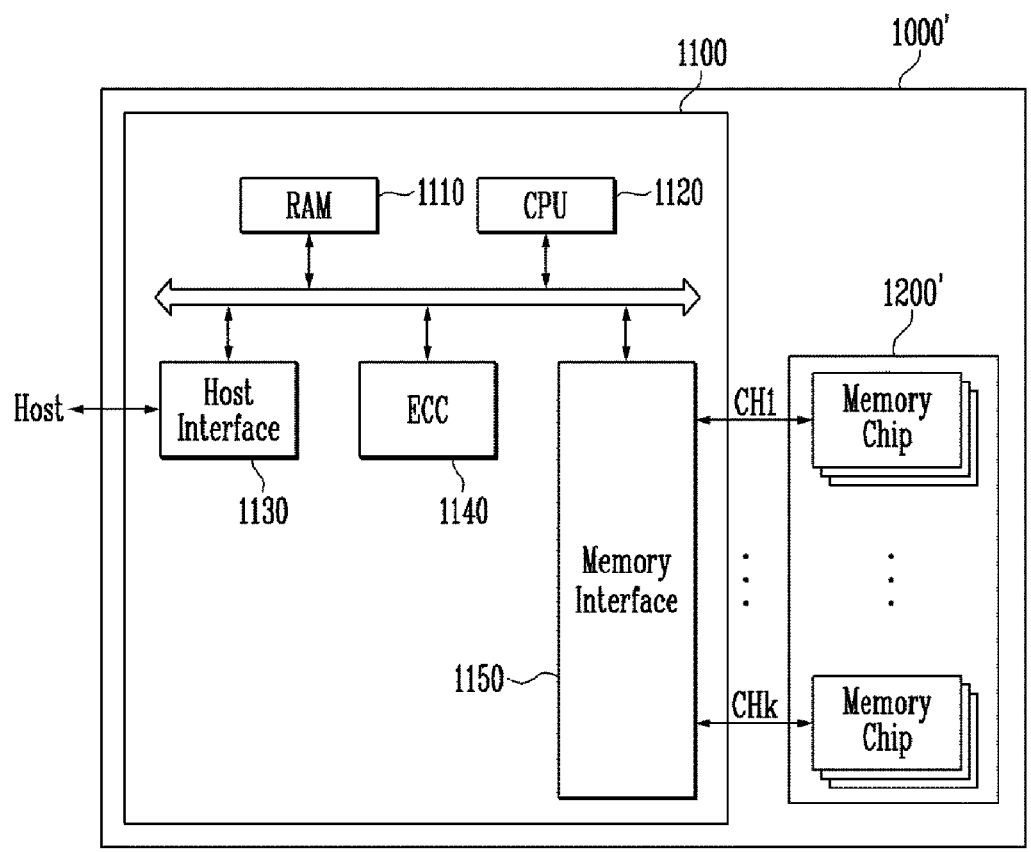

FIG. 4 is a block diagram illustrating an example of a representation of a structure of a memory system according to an embodiment. Hereinafter, any repetitive explanations concerning the above-described content will be omitted.

Referring to FIG. 4, a memory system 1000' according to the embodiments may include a memory device 1200' and a controller 1100. Also, the controller 1100 may include a RAM 1110, a CPU 1120, a host interface 1130, and an ECC circuit 1140, a memory interface 1150, and/or the like.

The memory device 1200' may be a nonvolatile memory, and include the memory string described with reference to FIGS. 1 to 2C. The memory device 1200' may be configured to include a dummy structure formed in a peripheral region of a substrate, insulating spacers passing through the dummy structure and protruding from an upper surface of the dummy structure, and first contact plugs passing through the insulating spacers and protruding from upper surfaces of the insulating spacers. A structure and a manufacturing method of the memory device 1200' are the same as described above, and thus, a detailed explanation may be omitted.

The memory device 1200' may be a multi-chip package including a plurality of memory chips. The plurality of memory chips are divided into a plurality of groups, and the plurality of groups are configured to communicate with the controller 1100 through first to $k^{th}$ channels CH1 to CHk. Also, memory chips included in one group are configured to communicate with the controller 1100 through a common channel. For reference, the memory system 1000' may be changed so that one memory chip is connected to one channel.

As described in the above descriptions, the memory system 1000' according to the embodiments may include the memory device 1200' which may be easily manufactured and has a stable structure, and thus, characteristics of the memory system 1000' may also be improved. In particular, since the memory device 1200' may constitute the multi-chip package, a data storage capacity of the memory system 1000' may be increased, and a driving speed may be improved.

Figure 5:
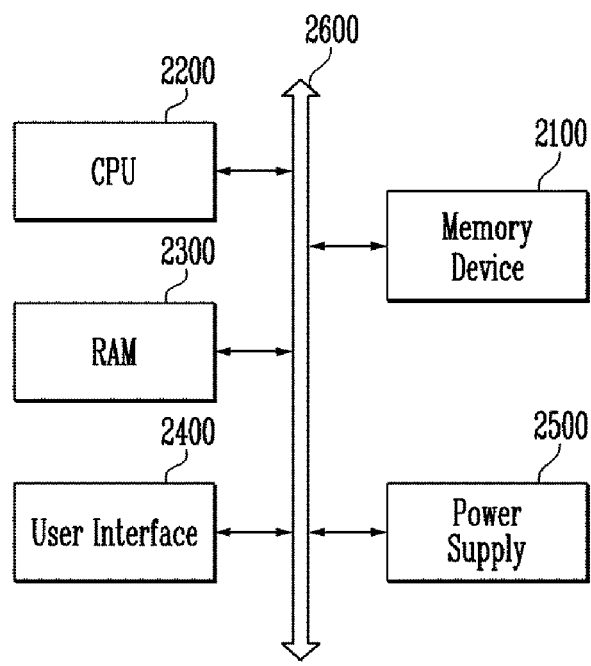
FIGS. 5 and 6 are block diagrams illustrating an example of a representation of structures of computing systems according to an embodiment.

FIG. 5 is a block diagram illustrating an example of a representation of a structure of a computing system according to an embodiment. Hereinafter, any repetitive explanations concerning the above-described content will be omitted.

Referring to FIG. 5, a computing system 2000 according to the embodiments may include a memory device 2100, a CPU 2200, a RAM 2300, a user interface 2400, a power supply 2500, a system bus 2600, and/or the like.

The memory device 2100 stores data provided through the user interface 2400, data processed by the CPU 2200, and/or the like. The memory device 2100 is electrically connected to the CPU 2200, the RAM 2300, the user interface 2400, the power supply 2500, and/or the like through the system bus 2600. For example, the memory device 2100 may be connected to the system bus 2600 through a controller (not illustrated), or directly connected to the system bus 2600. When the memory device 2100 is directly connected to the system bus 2600, a function of the controller may be performed by the CPU 2200, the RAM 2300, and/or the like.

Here, the memory device 2100 may be a nonvolatile memory, and may include the memory string described with reference to FIGS. 1 to 2C. The memory device 2100 may be configured to include a dummy structure formed in a peripheral region of a substrate, insulating spacers passing through the dummy structure and protruding from an upper surface of the dummy structure, and first contact plugs passing through the insulating spacers and protruding from upper surfaces of the insulating spacers. A structure and a manufacturing method of the memory device 2100 are the same as described above, and thus, a detailed explanation may be omitted.

The memory device 2100 may be the multi-chip package described in FIG. 4 including a plurality of memory chips.

The computing system 2000 having the above-mentioned structure may be a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, a digital video player, a device which receives or transmits information in a wireless environment, one of various electronic devices included in a home network, one of various electronic devices included in a computer network, one of various electronic devices included in a telematics network, an RFID device, etc.

As described in the above descriptions, since the computing system 2000 according to the embodiments may include the memory device 2100 having improved data reliability, data reliability of the computing system 2000 may also be improved.

Figure 6:
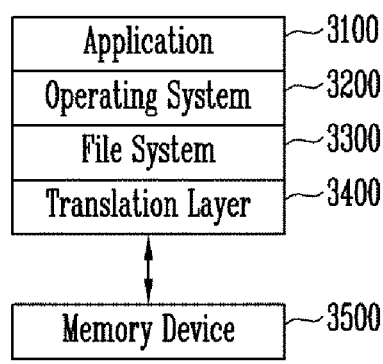

FIG. 6 is a block diagram illustrating an example of a representation of a computing system according to an embodiment.

Referring to FIG. 6, a computing system 3000 according to the embodiments may include a software layer, including an operating system 3200, an application 3100, a file system 3300, a translation layer 3400, and/or the like. The computing system 3000 may include a hardware layer such as a memory device 3500.

The operating system 3200 may be configured to manage software, hardware resources, and/or the like, of the computing system 3000, and control program execution of a CPU. The application 3100 may be a utility executed by the operating system 3200 as various application programs which are executed in the computing system.

The file system 3300 denotes a logic structure, which manages data, files, and/or the like, existing in the computing system 3000, and organizes a file to be stored in the memory device 3500 or data based on a regulation. The file system 3300 may be determined based on the operating system 3200 used in the computing system 3000. For example, when the operating system 3200 is the Windows series of the Microsoft Corporation, the file system 3300 may be a file allocation table (FAT), an NT file system (NTFS), and/or the like. When the operating system 3200 is the Unix/Linux series, the file system 3300 may be an extended file system (EXT), a Unix file system (UFS), a journaling file system (JFS), and/or the like.

In the figure, the operating system 3200, the application 3100, and the file system 3300 are described as individual blocks, however, the application 3100 and the file system 3300 may be included in the operating system 3200.

The translation layer 3400 may change an address into a suitable address type of the memory device 3500 in response to a request from the file system 3300. For example, the translation layer 3400 may change a logic address generated from the file system 3300 into a physical address of the memory device 3500. Here, mapping information of the logic address and the physical address may be stored in an address translation table. For example, the translation layer 3400 may be a flash translation layer (FTL), a universal flash storage link layer (ULL), and/or the like.

The memory device 3500 may be a nonvolatile memory, and may include the memory strings described with reference to FIGS. 1 to 2C as previously explained. Also, the memory device 3500 may be configured to include a dummy structure formed in a peripheral region of a substrate, insulating spacers passing through the dummy structure and protruding from an upper surface of the dummy structure, and first contact plugs passing through the insulating spacers and protruding from upper surfaces of the insulating spacers.

A structure and a manufacturing method of the memory device 3500 are the same as explained above, and thus, a detailed explanation will be omitted.

The computing system 3000 having the above-mentioned structure may be classified into an operating system layer performed in an upper level region and a controller layer performed in a lower level region. Here, the application 3100, the operating system 3200, and the file system 3300 may be included in the operating system layer, and may be operated by an operation memory of the computing system 3000. Also, the translation layer 3400 may be included in the operating system layer, or the controller layer.

As described in the above descriptions, since the computing system 3000 according to the embodiments may include the memory device 3500 which may be easily manufactured and has a stable structure, characteristics of the computing system 3000 may also be improved.

Since the semiconductor device may include a cell structure disposed in a cell region and a dummy structure disposed in a peripheral region, a step difference between the cell region and the peripheral region may be decreased. Also, a contact plug in the cell region may be simultaneously formed with a contact plug in the peripheral region. Thus, difficulty of a manufacturing process may be lowered, and structural stability may be increased.

It will be apparent to those skilled in the art that various modifications can be made to the above-described examples of embodiments without departing from the spirit or scope of the application.

What is claimed is:

1. A semiconductor device comprising:
a dummy structure formed on a peripheral region of a substrate and including first material layers stacked on each other and second material layers interposed between the first material layers, wherein the second material layers have an etching selectivity greater than the first material layers;
insulating spacers configured to pass through the dummy structure and protrude from an upper surface of the dummy structure; and
first contact plugs configured to pass through the insulating spacers and protrude from upper surfaces of the insulating spacers.

2. The semiconductor device of claim 1, further comprising a transistor formed under the dummy structure, and coupled to the first contact plugs.

3. The semiconductor device of claim 2, wherein the first contact plugs are coupled to a gate electrode or a junction of the transistor.

4. The semiconductor device of claim 2, wherein the transistor comprises:
a gate electrode; and
a gate insulating layer interposed between the gate electrode and the substrate.

5. The semiconductor device of claim 4, wherein the transistor comprises:
junctions formed within the substrate and at both sides of the gate electrode.

6. The semiconductor device of claim 1, further comprising:
a first interlayer insulating layer configured to cover the dummy structure; and
a second interlayer insulating layer formed over the first interlayer insulating layer.

7. The semiconductor device of claim 6, wherein the insulating spacers pass through the dummy structure and the first interlayer insulating layer, and the first contact plugs pass through the dummy structure, the first interlayer insulating layer, and the second interlayer insulating layer.

8. The semiconductor device of claim 6, further comprising an etch stop layer interposed between the first interlayer insulating layer and the second interlayer insulating layer, and
wherein the first contact plugs pass through the etch stop layer.

9. The semiconductor device of claim 1, wherein the first material layers include a conductive material and the second material layers include an insulating material.

10. The semiconductor device of claim 1, further comprising:
a cell structure formed on a cell region of the substrate and including a contact region;
second contact plugs connected to the contact region of the cell structure; and
supports configured to pass through the contact region of the cell structure.

11. The semiconductor device of claim 10, wherein the cell region has a height that is substantially similar to a height of the peripheral region.

12. The semiconductor device of claim 10, wherein the cell structure comprises:
conductive layers stacked in a stepwise shape and respectively connected to the second contact plugs; and
insulating layers interposed between the conductive layers.

13. The semiconductor device of claim 12, wherein the conductive layers stacked in the stepwise shape and respectively connected to the second contact plugs are gate electrodes of a memory cell or gate electrodes of select transistors.

14. The semiconductor device of claim 12, wherein the conductive layers stacked in the stepwise shape and respectively connected to the second contact plugs include at least one from the following: tungsten (W), tungsten nitride (WNx), titanium (Ti), titanium nitride (TiN), tantalum (Ta), and tantalum nitride (TaN).

15. A semiconductor device comprising:
a cell stacked structure formed on a cell region of a substrate and including a contact region having a stepwise shape;
a dummy stacked structure formed on a peripheral region of the substrate;
first insulating spacers passing through the dummy stacked structure and protrude from an upper surface of the dummy stacked structure;
first contact plugs passing through the first insulating spacers and protrude from upper surfaces of the first insulating spacers;
second contact plugs coupled to the contact region of the cell stacked structure; and
second insulating spacers surrounding side walls of the second contact plugs, wherein the second contact plugs protrude from upper surfaces of the second insulating spacers.

16. The semiconductor device of claim 15, further comprising:
a transistor formed under the dummy stacked structure and coupled to the first contact plugs.

17. A semiconductor device comprising:
a transistor;
first material layers, stacked over the transistor;
second material layers interposed between the first material layers, wherein the second material layers have an etching selectivity greater than those of the first material layers;
insulating spacers configured to pass through the first and second material layers; and
contact plugs configured to pass through the insulating spacers and protrude from upper surfaces of the insulating spacers,
wherein the contact plugs are coupled to the transistor.

* * * * *